United States Patent [19]

Pasch et al.

[11] Patent Number: 5,082,792
[45] Date of Patent: Jan. 21, 1992

[54] FORMING A PHYSICAL STRUCTURE ON AN INTEGRATED CIRCUIT DEVICE AND DETERMINING ITS SIZE BY MEASUREMENT OF RESISTANCE

[75] Inventors: Nicholas F. Pasch, Pacifica; Philippe Schoenborn, San Jose, both of Calif.

[73] Assignee: LSI Logic Corporation, Milpitas, Calif.

[21] Appl. No.: 568,269

[22] Filed: Aug. 15, 1990

[51] Int. Cl.⁵ .............................................. H01L 21/66
[52] U.S. Cl. .......................................... 437/7; 437/8; 437/170; 148/DIG. 162
[58] Field of Search .............................. 437/7, 8, 170; 148/DIG. 162; 324/158 R, 716, 719

[56] References Cited

U.S. PATENT DOCUMENTS

| | | | |
|---|---|---|---|
| 3,388,457 | 6/1968 | Totta | 437/8 |
| 3,851,245 | 11/1974 | Baker et al. | 437/8 |
| 3,974,443 | 8/1976 | Thomas | 324/716 |
| 4,218,650 | 8/1980 | Matzen | 324/719 |
| 4,347,479 | 8/1982 | Cullet | 324/716 |
| 4,386,459 | 6/1983 | Boulin | 437/8 |
| 4,456,879 | 6/1984 | Kleinknecht | 324/158 R |
| 4,516,071 | 5/1985 | Buehler | 324/158 R |
| 4,672,314 | 6/1987 | Kokkas | 324/158 R |
| 4,891,584 | 1/1990 | Kamieniecki et al. | 324/158 R |
| 4,898,841 | 2/1990 | Kanata | 437/200 |
| 4,903,112 | 2/1990 | Strack et al. | 357/55 |
| 4,906,593 | 3/1990 | Shioya et al. | 437/192 |
| 4,956,611 | 9/1990 | Maltiel | 437/8 |
| 4,978,627 | 12/1990 | Liu et al. | 437/8 |

Primary Examiner—Brian E. Hearn
Assistant Examiner—C. Chaudhari
Attorney, Agent, or Firm—Michael D. Rostoker; Gerald E. Linden

[57] ABSTRACT

A structure is formed on an electronic integrated circuit by altering the electrical characteristics of a diffused region of a substrate through a contact hole (window) in an insulating layer, in proportion to the size of said contact hole, such that the resistance of the diffused region is changed in a known and predictable fashion and may be measured electrically, giving indirect but accurate evidence of contact size in a completely non-destructive fashion. The measurements may be made on completed devices. Method and structure are disclosed.

10 Claims, 7 Drawing Sheets

FORMING A PHYSICAL STRUCTURE ON AN INTEGRATED CIRCUIT DEVICE AND DETERMINING ITS SIZE BY MEASUREMENT OF RESISTANCE

TECHNICAL FIELD OF THE INVENTION

This invention relates to the measurement of features created during the process of manufacturing electronic integrated circuits, and particularly to measurement of the size of electrical contacts formed on integrated circuits.

BACKGROUND OF THE INVENTION

In modern integrated circuits, electrical contacts are typically formed by depositing a conductive material through a hole in an insulating layer of a semiconductor device, thereby forming an electrical contact with the material below. U.S. Pat. No. 4,631,248 (Pasch, Dec. 23, 1986) describes one method of forming an electrical contact in an integrated circuit. The electrical characteristics of such a contact are heavily dependent upon the size of the hole in the insulating layer.

In some applications, it is extremely desirable to know the size of the hole in the insulating layer when a contact is formed, as this gives a great deal of information about the integrated circuit manufacturing process and the quality and properties of the resultant device. Unfortunately, in modern devices, contacts are often created with dimensions of 1 micron and less, and it becomes extremely difficult to inspect and measure their size. The small size of such contact holes makes them impossible to measure optically, requiring expensive scanning electron microscope (SEM) inspection tools. Further, these measurements must be made while the device is in process, because in the normal processing of the integrated circuit, the contact hole will either be filled or etched away. If the hole has been filled, it is obscured and cannot be measured, and if it has been etched away, the original hole will have been distorted in a manner which leaves no evidence of the contact size.

As a result, only two options are available for contact measurement with the current state of the art. The first is to examine the device while it is still in process, after the hole in the insulating layer has been made, but before it has been filled with conductor or has been otherwise altered. The second is to make cross-sections of a completed device and to examine it, again with SE tools.

The problem with the first method, whereby the device is inspected before it is completed, is that the effect of further processing steps will not be evident, and any information gathered may be misleading. In addition, it is extremely difficult to determine if there is any kind of undercut in the hole in the insulator, that is, if the hole is larger at the bottom than it is at the top, and the apparent dimensions of the hole may not give a good indication of the actual contact size.

The second method, which allows for "dissection" of a completed device, whereby the completed device is physically cross-sectioned and is examined with an SEM, is far more conclusive and accurate in its measurements, but destroys the device in the process of measurement. Often, these devices are extremely valuable and scarce, and it is difficult and expensive to sacrifice any significant number of devices in order to "fine tune" the manufacturing process.

In light of the problems with direct measurement of contact features, indirect measurement techniques which give good evidence of feature sizes become extremely attractive. However, the present state of the art provides no mechanism for measuring a contact indirectly. Some techniques are available which allow for the measurement of doping profiles, channel lengths, line widths, etc., but these are usually based either on measurement of the resistance of a bar, or on resistive ratiometric measurements and are not applicable to the problems of contact size measurement.

Even though it is possible to measure the resistance of a diffused region below an insulating layer and to determine its size, this methodology give no indication of size of a contact formed through a hole in the insulating layer, and is, in fact, almost completely independent of contact size.

U.S. Pat. No. 3,388,457 (Totta, June 18, 1968) describes a method by which contacts may be formed on an integrated circuit, such that contact resistance may be measured. While contact resistance is an extremely important "bottom-line" parameter, it is dependent upon a number of processing parameter including contact size, diffusion characteristics, contamination of the via hole during processing, etc., whose individual contributions may not be determined by this method. Since the individual contributors to contact resistance may not be determined, this method is not well suited to process tuning, other than to indicate the presence or absence of a problem.

Another resistance method of contact quality determination is described in U.S. Pat. No. 3,851,245 (Baker et al., Nov. 26, 1974). In this method, holes in addition to the contact hole are provided. These are subsequently probed electrically, giving evidence that the holes in the insulating layer are either open or not, by virtue of the measured resistance. Again, this method gives evidence of a processing problem, but does not provide enough information for process tuning.

U.S. Pat. No. 3,974,443 (Thomas, Aug. 10, 1976) describes a method of measuring line width on an integrated circuit by direct resistance measurement, and U.S. Pat. No. 4,347,479 (Cullet, Aug. 31, 1982) describes a method of measuring photolithographic tolerances by integrating resistance bridges onto the wafer by which differences in line width may be measured evidentially by determining resistance ratio differences.

A different approach to resistance measurement as it applies to doping profiles in integrated circuits is given in U.S. Pat. No. 4,456,879 (Kleinknecht, June 24, 1984), whereby a D.C. current is applied to a semiconductor device, and a high-frequency modulated laser light source is used to illuminate the semiconductor at various points. Photocurrent variations resulting from moving the point of laser illumination provide evidence of doping profile in the form of a signal related to conductivity of the semiconductor.

U.S. Pat. Nos. 4,516,071 (Buehler, May 7, 1985) and 4,672,314 (Kokkas, June 9, 1987) provide additional examples of integrated test structures whereby resistance is used to measure integrated circuit device characteristics.

While all of the aforementioned resistance (or conductance) measurement methods provide useful information about integrated circuit devices, most of them make measurements which are dependent upon a large number of different process parameters, thus making it difficult, if not impossible, to determine the contributions of any single parameter. Those methods that do make a direct measure of a feature size, use the conductivity characteristics of a uniform bar to determine a line width or channel length. None of these techniques are suitable for measurement of the actual size of a contact interface area.

DISCLOSURE OF THE INVENTION

It is therefore an object of the present invention to provide a contact structure which may be probed electrically to determine the actual size of the contact interface area.

It is another object of the invention to provide a technique for determining the size of a contact area on a semiconductor device.

According to the present invention, a special contact structure is formed such that resistive measurements may be made which do give accurate evidence of contact size. This is accomplished by creating a diffused region in a semiconductor substrate for contact interface and ion implanting into it (or otherwise "damaging" it or altering its electrical characteristics) through the contact hole in the overlying insulating layer such that the area of electrical modification is very closely related to the size of the contact hole. The resistivity (or conductivity) of the unmodified diffused region is determined by normal means (i.e., electrical probing of the diffused region outside of the area of modification) and a current is passed through the diffused region including the area of modification. The resulting resistance measurement gives very accurate evidence of contact size, via a mathematical relationship, described hereinafter.

One major advantage of the present invention is that it allows for accurate measurement of contact size in a completely nondestructive fashion. This makes it particularly well suited to frequent sampling of production parts, real-time testing, on-line process tuning, etc.. Additionally, certain military applications and very-high reliability applications would be significantly enhanced by the ability to verify actual contact dimensions on every device.

Other objects, advantages and features of the invention will become apparent in light of the following description thereof.

BRIEF DESCRIPTION OF THE DRAWINGS

FIG. 2b is a plan view of the diffuse region shown in FIG. 2a.

DETAILED DESCRIPTION OF THE INVENTION

Figure 1:
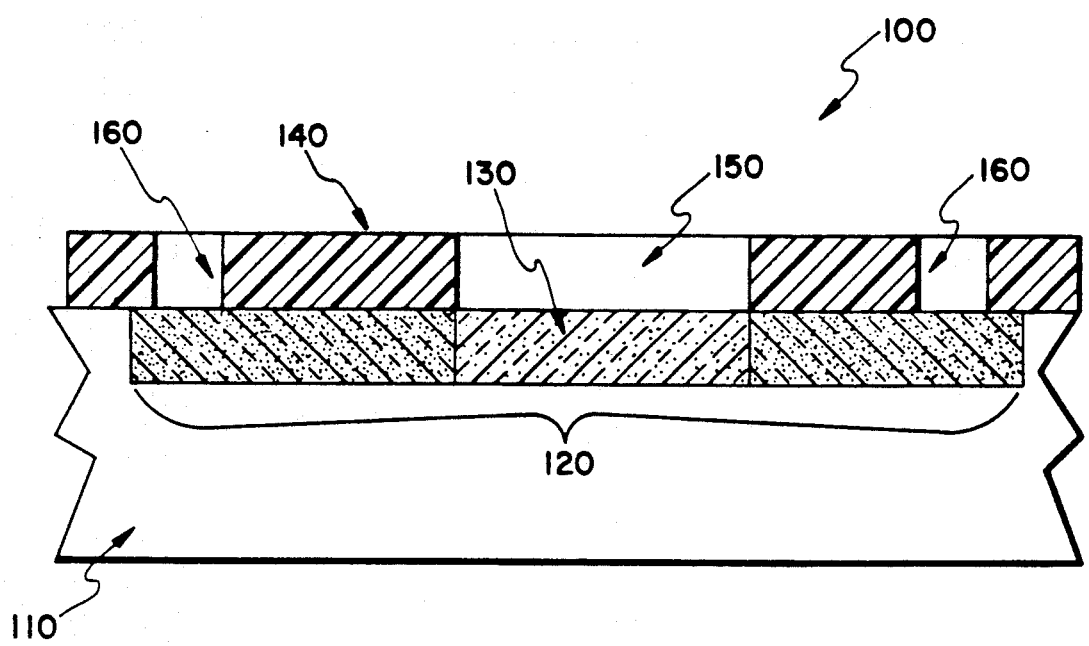
FIG. 1 is a cross-section of an electrical contact substructure embodying the principles of the present invention.

FIG. 1 shows a contact substructure 100 comprising a diffused region 120 in a semiconductor substrate 110 to which it is desired to effect an electrical contact, and an overlying insulating layer 140, into which there has been etched a contact hole 150 (such as by plasma etching), and through which (or around which) there have been provided access points 160 to the diffused region 120 by which electrical measurements may be made.

Also with reference to FIG. 1, an area of electrical deformation 130 of the diffused region is created by ion-implantation through the contact hole (or other process of deposition or diffusion through the hole), such that the size of said area of deformation will be closely related to the size of said contact hole, and rendering it effectively nonconductive to current flowing across the diffused region via the access points 160. This area of electrical deformation may, in one embodiment, be formed by doping with a material which will effectively invert the conductivity of the diffused region, thereby creating a diode structure which may be useful as a contact, but which may be reverse biased against a current (230 with respect to FIGS. 2a and 2b) injected via access points 160 rendering it effectively non-conductive for the purposes of resistance measurement.

In another embodiment, an insulating slug of non-activated dopant may be deposited (i.e. at 130) into the diffused region 120. In this case, the measurement is possible, but the structure is useful only as a test structure, since an insulating slug is useless as a contact material.

Once the substructure 100 has been formed, further process steps may be performed whereby the contact hole may be filled or otherwise processed. Under normal circumstances, this would obscure or alter the contact hole such that measurement of its original size would be impossible. But in the structure of the present invention, the modified area 130 leaves behind a feature, the area of electrical deformation 130, closely related to the original size of the contact hole. After all processing steps have been completed, (or for that matter, once the substructure has been completed) the nominal resistivity, $\rho$, of the diffused region 120 must be determined, via normal means.

Figure 2A:
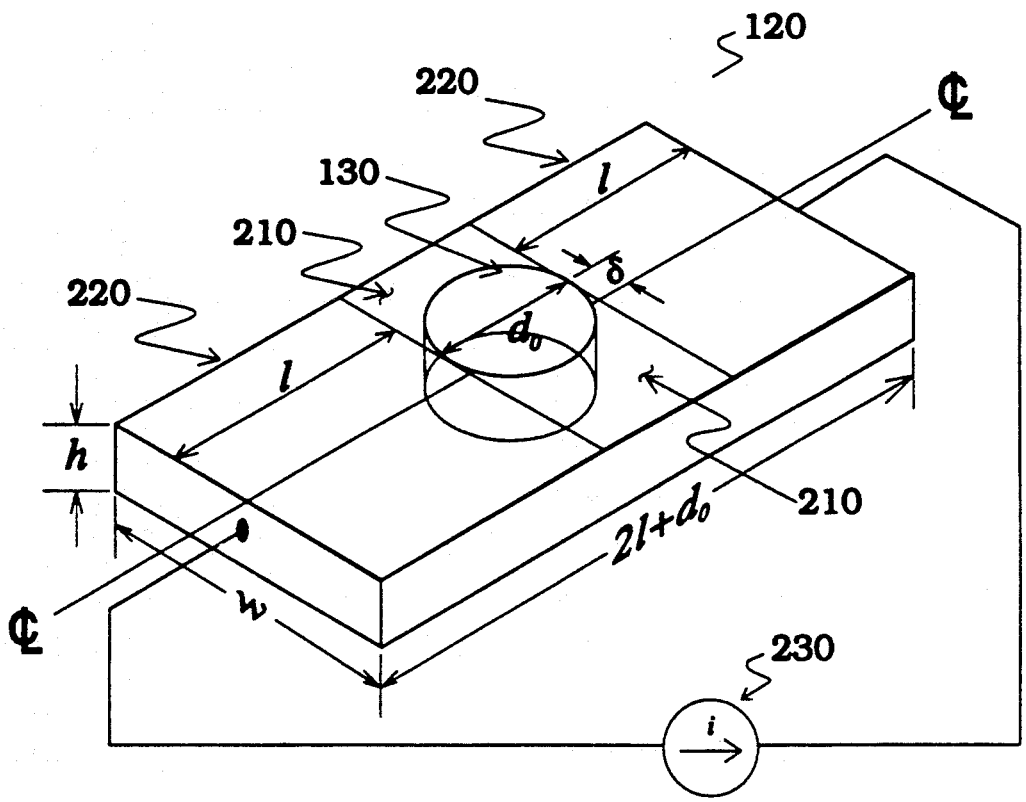
FIG. 2a is an isometric drawing of a diffuse region having an area of electrical deformation a it relates to the present invention, with the overlying layer(s) removed.
Figure 2B:
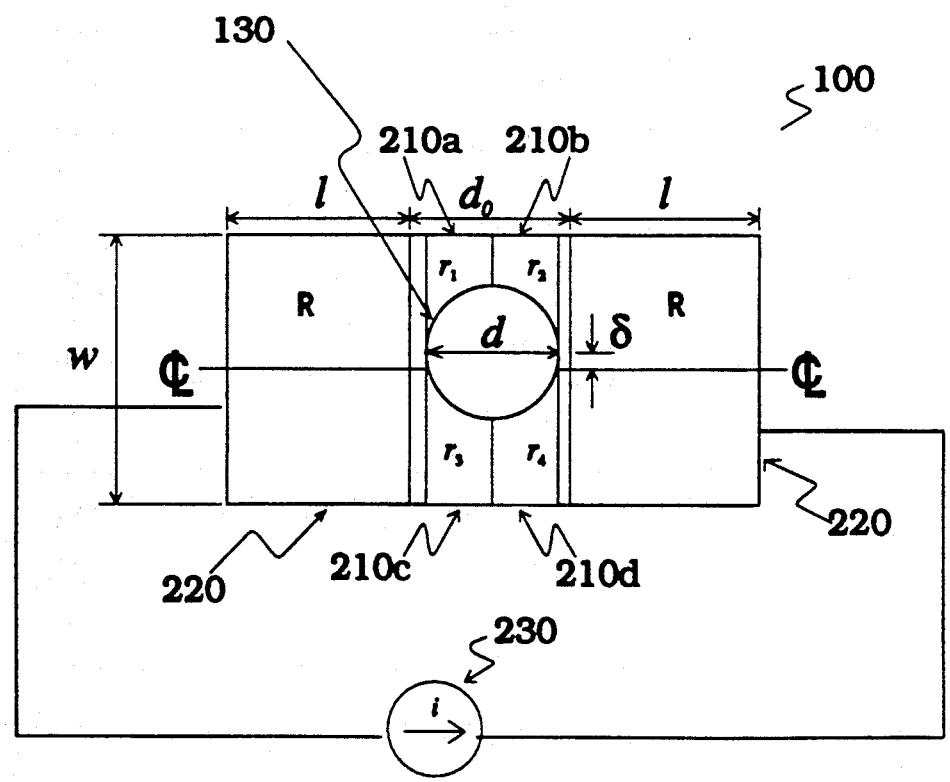

With respect to FIGS. 2a and 2b, a current 230 is passed through the diffused region 120 across the modified region 130. A bias voltage may be applied, as necessary, to the modified region 130 to render it nonconductive to said injected current. By this method the resistance $R_T$ for the diffused region 120 is determined.

The relationship between the resistance value $R_T$ and hole diameter d is given in the following analysis.

The contact hole (150 with respect to FIG. 1) has a nominal diameter of $d_O$. When the underlying diffused region 120 is implanted or modified, it produces the modified region 130 with a diameter of d. The difference between d and $d_O$ may be due to manufacturing variations which cause the contact hole 150 to deviate from its nominal size, and due to peculiarities of the diffusion characteristics of the substrate and insulating materials. The alignment of the contact hole (150) may also be offset from the centerline of the diffused region (120) by an offset, $\delta$. In any case, the diameter d of the modified region 130 will be very closely related to the actual diameter of the contact hole 150.

With respect to FIGS. 2a and 2b, and given that we know the nominal diameter $d_O$ of the contact hole 150, and the width w, height h and total length L of the diffused region 120 which is given by:

$$L = 2l + d_O$$

we may observe that the resistance $R_T$ of the diffused region 120 is composed of two parts. The first part is the resistance R of two rectangular subregions 220, each of which measures $l \times w \times h$. The second part is the resistance of the rectangular area 210 (measuring $d \times w \times h$), containing the modified region (area) 130. This will be seen as the parallel resistance of the two component parts of 210 on either side of the modified region 130.

With reference to FIG. 2b, the hole element resistance (i.e., the resistance of the area 210) may be divided into four separate resistance components $r_1$, $r_2$, $r_3$, and $r_4$, corresponding to four component regions 210a, 210b, 210c and 210d, respectively, of the area 210, such that $r_1 = r_2$, on one side of the modified area, and $r_3 = r_4$, on an opposite side of the modified area. The equivalent resistance of the hole element is given by:

$$\frac{1}{r'} = \frac{1}{r_1 + r_2} + \frac{1}{r_3 + r_4} = \frac{1}{2r_1} + \frac{1}{2r_3} = \frac{1}{2} \frac{r_3 + r_1}{r_1 r_3}$$

or $$r' = \frac{2 r_1 r_3}{r_1 + r_3}$$

Total resistance, then, is given by:

$$R_T = 2R + r'$$

or $$R_T = \frac{(2l + d_0 - d)\rho}{wh} + r'$$

where $\rho$ is the conductor's resistivity.

Calculating r1, r3 by integration of small elements $\Delta x$:

$$\Delta r = \frac{\rho \Delta x}{h w(x)}$$

$$w(x) = \frac{W}{2} - \delta - \sqrt{\left(\frac{d}{2}\right)^2 - x^2}$$

In the case where r1 > r3 (arbitrary choice):

$$r_1 = \int_0^{d/2} \Delta r = \int_0^{d/2} \left(\frac{\rho}{hW(x)}\right) dx =$$

$$\frac{\rho}{h} \int_0^{d/2} \left(\frac{1}{\frac{W}{2} - \delta - \sqrt{\left(\frac{d}{2}\right)^2 - x^2}}\right) dx$$

$$r_3 = \int_0^{d/2} \Delta r = \int_0^{d/2} \left(\frac{\rho}{hW(x)}\right) dx =$$

$$\frac{\rho}{h} \int_0^{d/2} \left(\frac{1}{\frac{W}{2} + \delta - \sqrt{\left(\frac{d}{2}\right)^2 - x^2}}\right) dx$$

In order to integrate, the following transformation is used:

$$2x = d\sin(t), \quad dx = \frac{d}{2}\cos(t) dt$$

at $x = 0$, $t = 0$; and at $x = \frac{d}{2}$, $t = \frac{\pi}{2}$ $$r_1 = \frac{\rho}{h} \int_0^{\frac{\pi}{2}} \left(\frac{\frac{d}{2}\cos(t)}{\frac{W}{2} - \delta - \sqrt{\left(\frac{d}{2}\right)^2 - \left(\frac{d}{2}\right)^2 \sin^2(t)}}\right) dt = \frac{\rho}{h} \int_0^{\frac{\pi}{2}} \left(\frac{\frac{d}{2}\cos(t)}{\frac{W}{2} - \delta - \frac{d}{2}\sqrt{1 - \sin^2(t)}}\right) dt$$

$$= \frac{\rho}{h} \int_0^{\frac{\pi}{2}} \left(\frac{\frac{d}{2}\cos(t)}{\frac{W}{2} - \delta - \frac{d}{2}\sqrt{\cos^2(t)}}\right) dt = \frac{\rho}{h} \int_0^{\frac{\pi}{2}} \left(\frac{\frac{d}{2}\cos(t)}{\frac{W}{2} - \delta - \frac{d}{2}\cos(t)}\right) dt$$

$$= \frac{\rho}{h} \int_0^{\frac{\pi}{2}} \left( \frac{d\cos(t)}{W - 2\delta - d\cos(t)} \right) dt = \frac{\rho}{h} \int_0^{\frac{\pi}{2}} \left( \frac{\cos(t)}{\frac{W - 2\delta}{d} - \cos(t)} \right) dt$$

Integrating, this becomes:

$$r_1 = \frac{\rho}{h} \left( -\frac{\pi}{2} + \frac{2(W - 2\delta)}{d} \tan^{-1} \left[ \frac{1 + \frac{W - 2\delta}{d}}{\sqrt{\left(\frac{W - 2\delta}{d}\right)^2 - 1}} \right] \frac{1}{\sqrt{\left(\frac{W - 2\delta}{d}\right)^2 - 1}} \right)$$

$$r_3 = \frac{\rho}{h} \left( -\frac{\pi}{2} + \frac{2(W - 2\delta)}{d} \tan^{-1} \left[ \frac{1 + \frac{W + 2\delta}{d}}{\sqrt{\left(\frac{W + 2\delta}{d}\right)^2 - 1}} \right] \frac{1}{\sqrt{\left(\frac{W + 2\delta}{d}\right)^2 - 1}} \right)$$

If $|\delta| \rightarrow \left(\frac{W}{2} - \frac{d}{2}\right)$, then $\begin{vmatrix} r_1 \rightarrow \infty, r' \rightarrow 2r_3 \\ \text{or} \\ r_3 \rightarrow \infty, r' \rightarrow 2r_1 \end{vmatrix}$ For all of the following analysis, the following assumptions are made:
 w = 2.0 microns
 ρ = 1.0
 h = 0.5 microns
 l = 2.0 microns
 $d_O$ = 1.0 microns
where w, h, l, $d_O$, an $d\rho$ refer to the width, height, length, nominal hole diameter, and resistivity with respect to the diffuse region illustrated in FIG. 2.

In order to determine the sensitivity of the total resistance to hole diameter, it is necessary to consider the component portions of that resistance.

Figure 3:
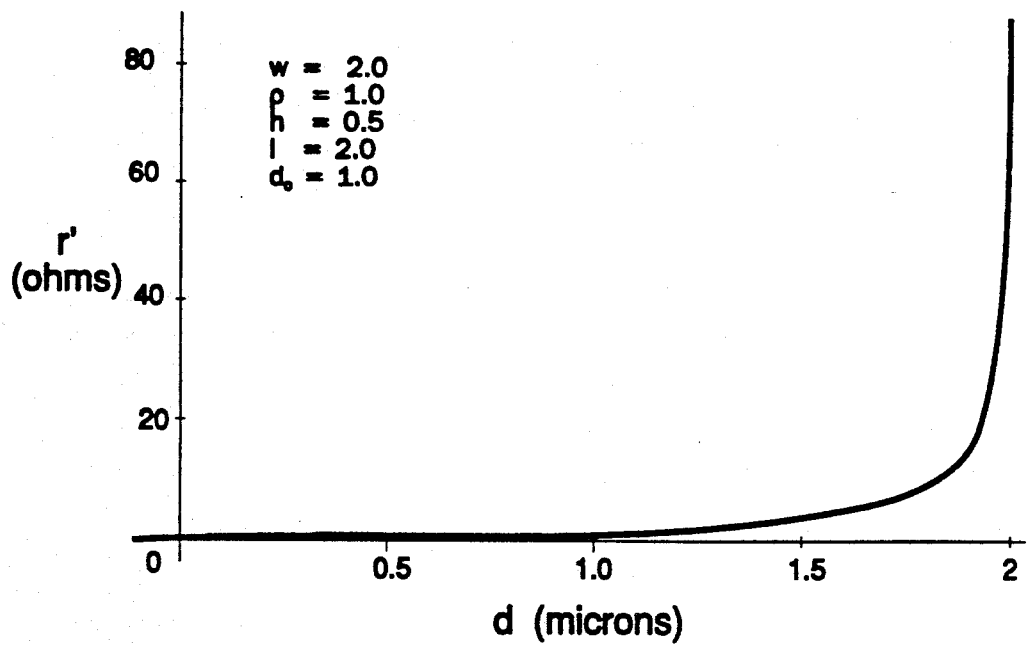
FIG. 3 is a plot of resistance of the portion of the diffuse region bounding the hole versus hole diameter, as it relates to the present invention, where the hole is perfectly centered.

First, we consider the r' component, which is made up of the four regions $r_1$, $r_2$, $r_3$, and $r_4$ (or 210a, b, c, and d, with respect to FIG. 2a). Using the assumptions given above, FIG. 3 is a plot of r' versus hole diameter d assuming that the hole is perfectly centered within the diffused region (i.e., δ = 0). The resistance varies slowly with hole diameter until the hole diameter approaches the total width (w) of the diffused region, at which point it divides the diffused region into two disjoint parts and the resistance becomes infinite.

Figure 4:
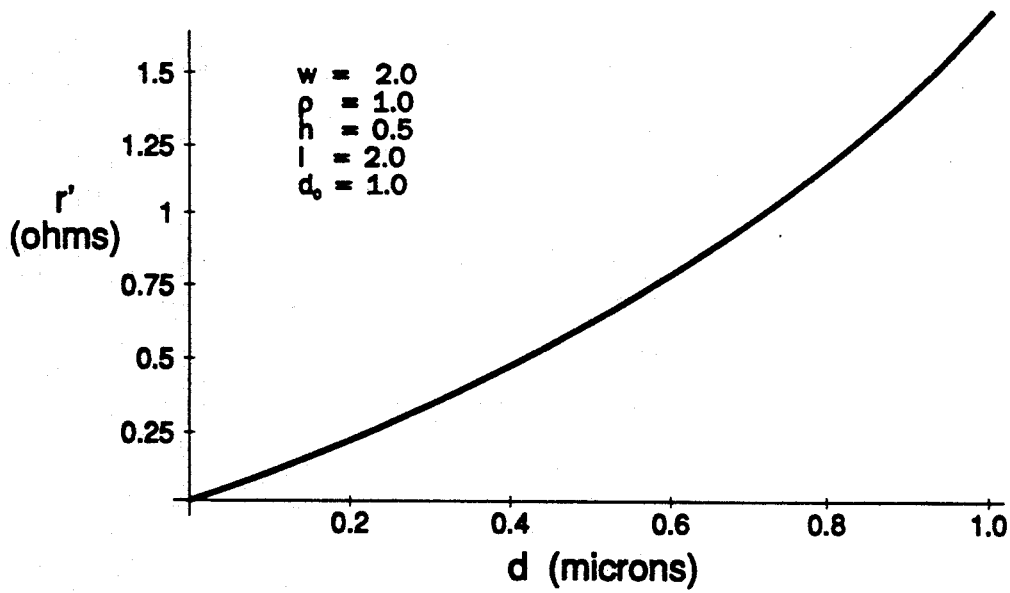
FIG. 4 is an expansion of an area of the plot in FIG. 3

FIG. 4 is an expansion of the plot of FIG. 3 over the range from d = 0 to d = $d_0$. This shows the contribution of r' to total resistance as d varies form 0 to ½ of the width (w) of the diffused region. It can be readily seen that the r' component varies a little over 1.5 ohms over this range, and that the slope of the curve is steeper as the diameter (d) increases.

Figure 5:
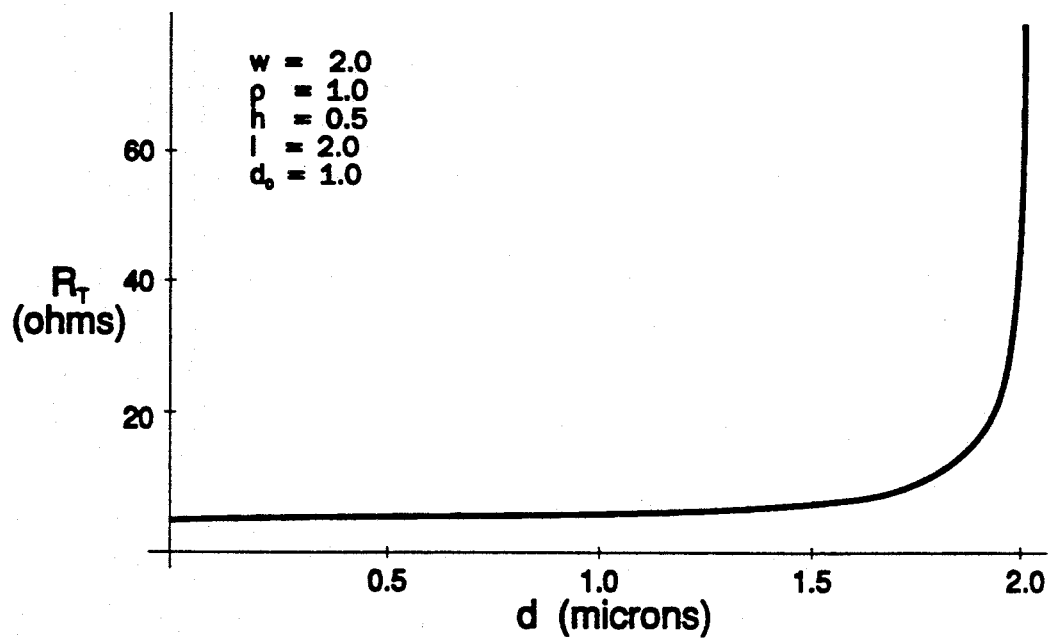
FIG. 5 is a plot of the total resistance of the portion of the diffuse region bounding the hole versus hole diameter, as it relates to the present invention, where the hole is perfectly centered

Next, we consider the total resistance of the diffused region, by adding in the contribution of the two rectangular regions (220 with respect to FIG. 2a). FIG. 5 shows the total resistance, $R_T$, versus diameter, for δ = 0, from d = 0 to d = w. This shows a similar characteristic to that of the r' contribution, but contains a baseline resistance due to the additional resistance contributed by the rectangular regions 220. It should be noted that the resistance of the rectangular regions is not constant. This is because the length "l" of the rectangular regions decreases with hole diameter such that the 2l + d is constant.

Figure 6:
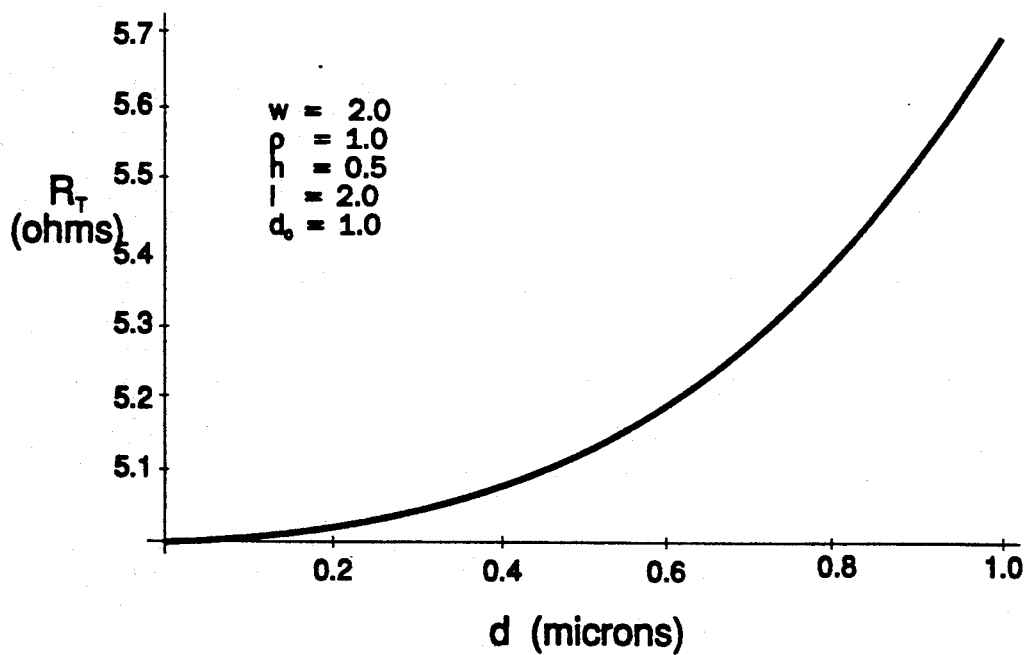
FIG. 6 is an expansion of an area of the plot in FIG. 5.

In similar manner to FIG. 4, FIG. 6 is an expansion of the plot of FIG. 5 over the range of d = 0 to d = $d_0$. As would be expected, the shapes of the curves of both FIGS. 5 and 6 are similar to those of FIGS. 3 and 4, but include a baseline offset of a few ohms due to the contribution of the rectangular regions 220. It is important to note that the resistance change of the total resistance $R_T$ over this range is less than that of r'. This is because a r' increases (due to larger hole diameter) the contribution of the rectangular areas decreases (due to the shortened length, due in turn to the larger hole diameter). This has the effect of compressing the total resistance change for any given range of hole diameters. The change of the total resistance $R_T$ over the same range as used for the plot of FIG. 4 is approximately 0.7 ohm, as compared to the 1.75 ohm change in r'.

Figure 7:
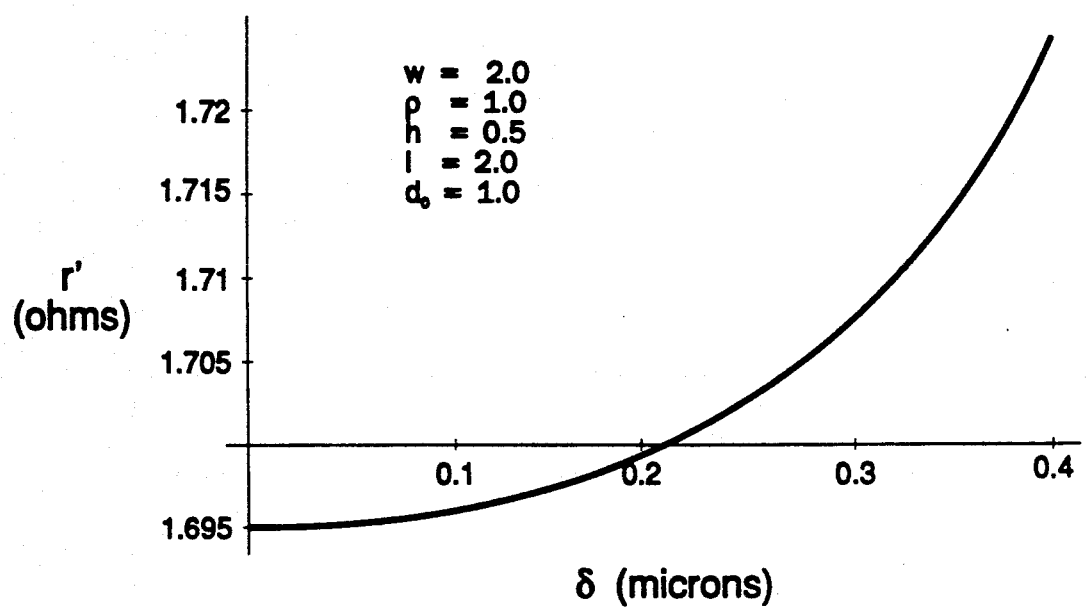
FIG. 7 is a plot of the resistance of the portion of the diffuse region bounding the hole, versus hole offset, as it relates to the present invention.

FIG. 7 is a plot of the resistance r' of the portion of the diffused region bounding the hole versus hole offset δ, where the hole diameter has been fixed at its nominal value, $d_O$. This offset would correspond to a minor mask misalignment in the fabrication process. This plot demonstrates that for offsets of up to 40% (i.e., 0.4 microns) of the hole diameter ($d_0$ = 1.0 microns), the variation in this partial resistance is only about 1.8%. For offset variations over a 20% range (i.e., from 0.0 to 0.2 microns), the variation is less than 0.5%.

Figure 8:
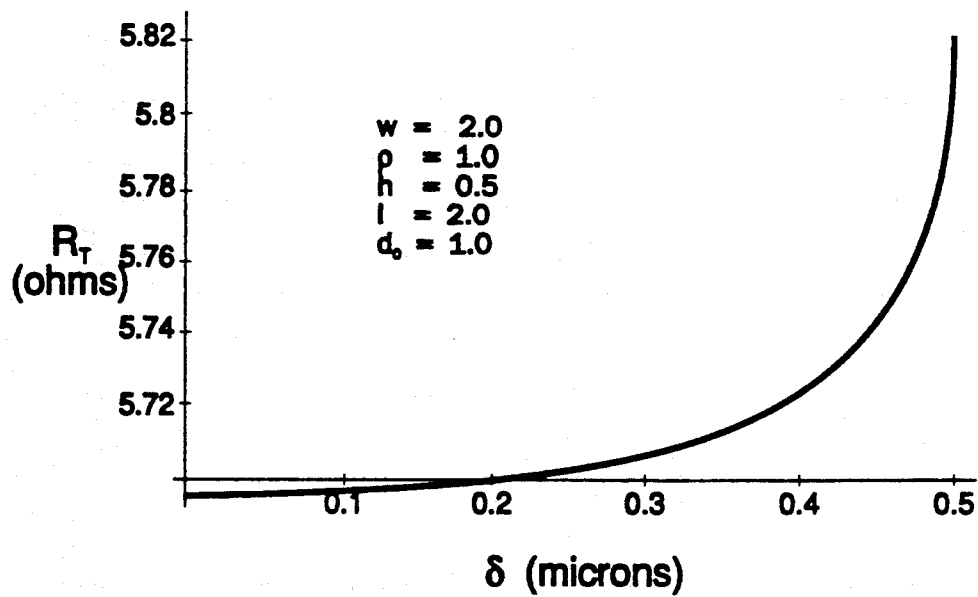
FIG. 8 is a plot of the total resistance of the diffuse region, versus hole offset from the centerline of the region, as it relates to the present invention.

FIG. 8 is a plot of total resistance $R_T$ of the diffused region versus hole offset δ. This plot shows the relative insensitivity of the total resistance to hole offset for offsets of less than 30%.

Figure 9:
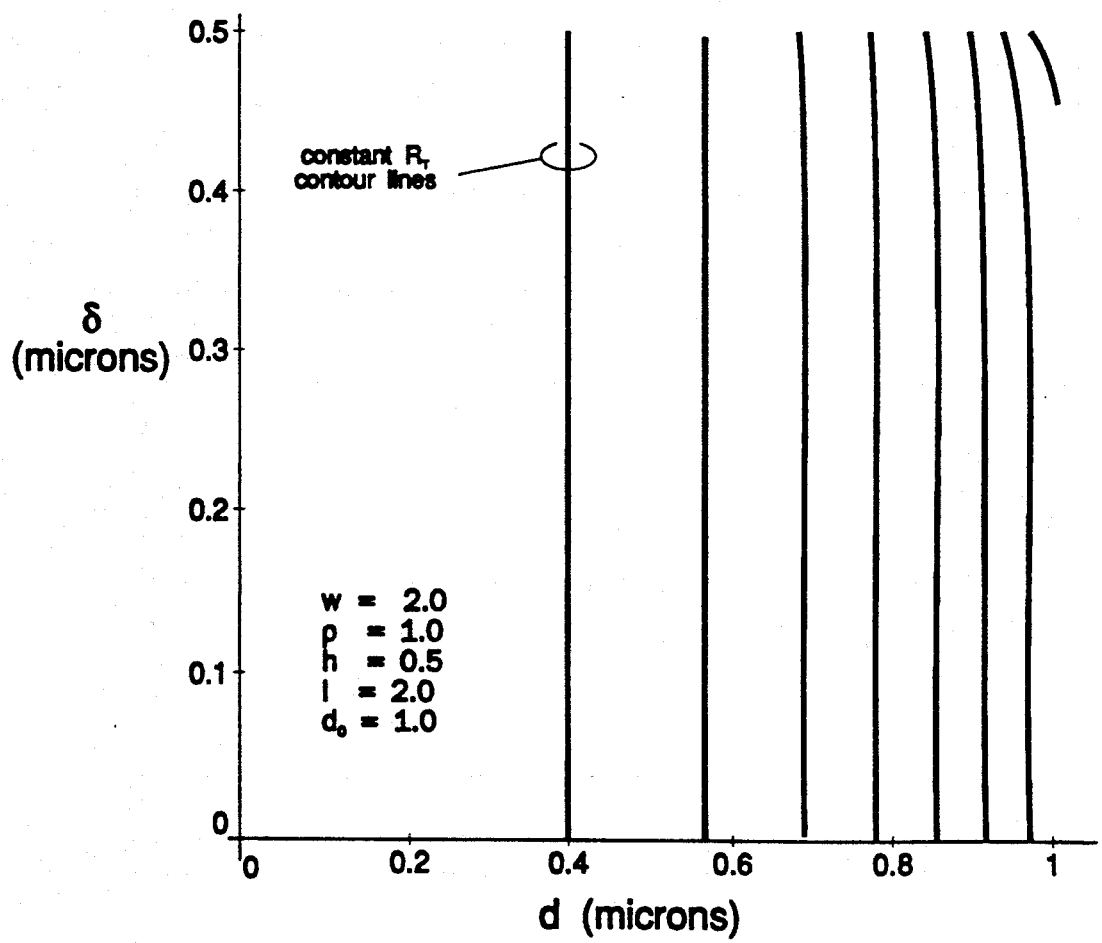
FIG. 9 is a contour plot showing constant total resistance contour lines (of the diffuse region) versus hole offset and hole width, as it relates to the present invention.

FIG. 9 is a contour plot of total resistance versus both hole diameter and hole offset. The vertical nature of the contour lines indicates that for hole diameters less than half of the width of the diffused region, the total resistance is almost completely insensitive to offset due to misalignment.

Since the sensitivity to offset is so low when the hole diameter is relatively small (i.e., less than half the width of the diffused region; or substantially smaller than the width of the diffused region), the width of the diffused region can be made arbitrarily large compared to hole diameter (2:1 or so) and the offset component would be dropped entirely. When this is done:

$$r_1 = \frac{\rho}{h}\left(-\frac{\pi}{2} + \frac{2W}{d}\tan^{-1}\left[\frac{1+\frac{W}{d}}{\sqrt{\left(\frac{W}{d}\right)^2 - 1}}\right]\frac{1}{\sqrt{\left(\frac{W}{d}\right)^2 - 1}}\right)$$

and $$r_1 = r_2 = r_3 = r_4$$

and $$r' = 2r_1 r_3/(r_1 + r_3) = 2r_1$$

from the previous analysis, we know that:

$$R_T = \frac{(2l + d_0 - d)\rho}{wh} + r'$$

Therefore the simplified expression for $R_T$, with the effects of $\delta$ eliminated, is given by:

$$R_T = \frac{(2l + d_0 - d)}{wh} + 2r_1$$

$$= \frac{(2l + d_0 - d)\rho}{wh} + \frac{\rho}{h}\left(-\frac{\pi}{2} + \frac{2W}{d}\tan^{-1}\left[\frac{1+\frac{W}{d}}{\sqrt{\left(\frac{W}{d}\right)^2 - 1}}\right]\frac{1}{\sqrt{\left(\frac{W}{d}\right)^2 - 1}}\right)$$

Figure 10:
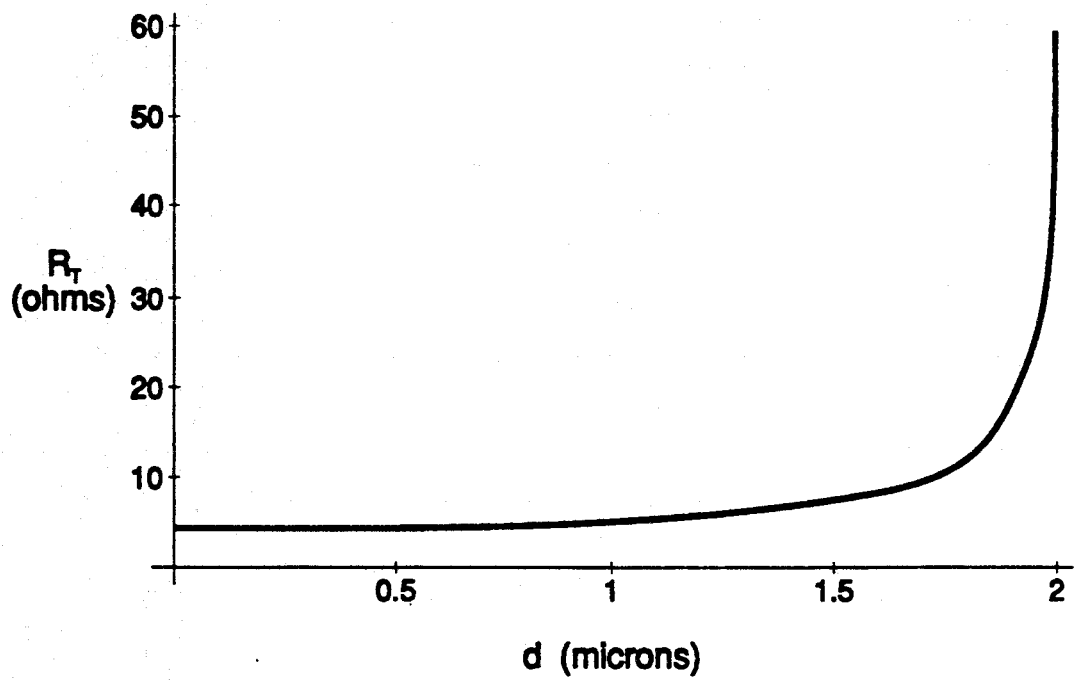
FIG. 10 is a plot of the total resistance of the diffuse region versus hole diameter after adjusting for the assumption that hole offset does not contribute significantly to total resistance, as it relates to the present invention.
Figure 11:
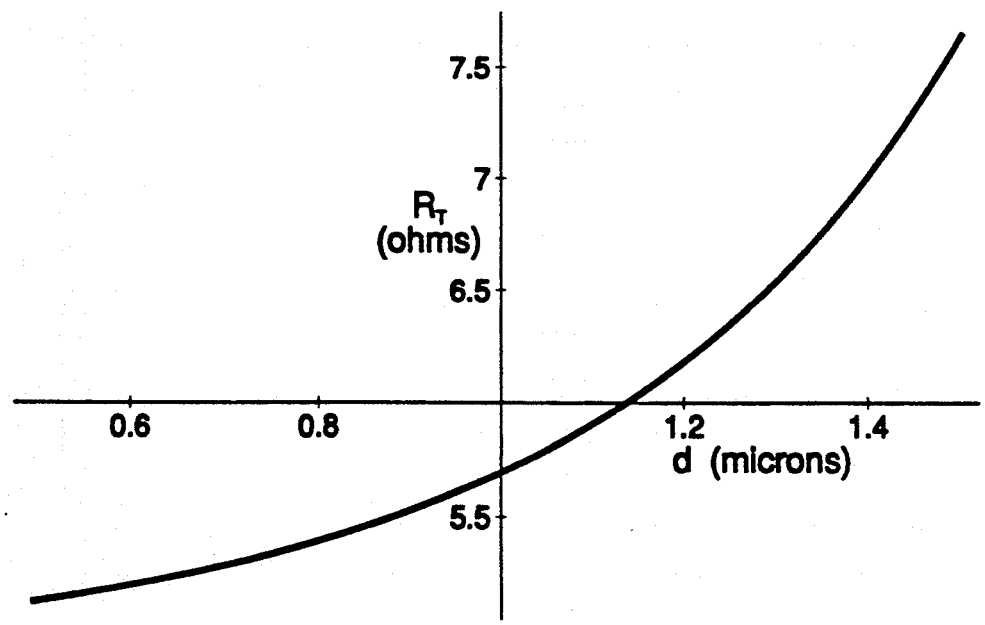
FIG. 11 is an expansion of an area of the plot in FIG. 10.

FIGS. 10 and 11 represent the total resistance versus hole diameter, after discarding (ignoring) the effect of hole offset, as justified above.

From the preceding analysis, it is possible to backcalculate the actual value of d (diameter of the modification region) which gives a very close representative value for the contact hole diameter.

While the preceding analysis was performed for a circular contact window (150), similar analysis can be made for other geometries, such as square or rectangular contact holes, with similar results.

In summary, the total resistance R: is independent of contact offsets $\delta$ parallel to the current direction, because while it makes one of the elements 220 (See FIGS. 2a and 2b) shorter by $\delta$, it makes the other element 220 longer by the same amount and the overall resistance does not change.

Further, it is preferable to create at least two separate contact structures (100), arranged orthogonally with respect to one another, for determining contact size. It is also preferable, to create a contact structure (100) having a hole diameter (d) approximately equal to the width (w) of the structure in order to determine the offset $\delta$.

What is claimed is:

1. A method of measuring the size of an electrical contact structure formed above a diffused region in a semiconductor substrate, said contract structure including a contact hole extending to the diffused region, comprising:
   electrically modifying an area within the diffused region, rendering it effectively nonconductive;
   providing access points to the diffused region outside of the electrically modified area for measuring resistance;
   measuring the change in the resistance of the diffused region attributable to the modified area; and
   correlating the change to a dimension for the modified area.

2. A method of forming and measuring the size of an electrical contact structure in an integrated circuit by:
   diffusing a region in a semiconductor substrate with which an electrical contact is to be made;
   forming an insulating layer atop said diffused region;
   providing a contact window to the diffused region;
   modifying the electrical characteristics of the diffused region immediately below the contact window, thereby forming a modified area of the diffused region that is rendered nonconductive to currents passing across it in the diffused region;
   providing other access to the diffused region such that electrical probing may be performed;
   establishing the resistivity of the unmodified diffused region;
   measuring the resistance across an area of the diffused region including the modified area; and
   calculating the size of the modified area of the diffused region by resistive analysis, thus providing an accurate approximation to the size of the original contact window in the insulating layer.

3. A method of forming and measuring the size of an electrical contact structure in an integrated circuit by:
   diffusing a region in a semiconductor substrate with which an electrical contact is to be made;
   forming an insulating layer atop said diffused region;
   providing a contact window to the diffused region by forming an opening in the insulating layer by etching;
   modifying the electrical characteristics of the diffused region immediately below the contact window by ion implantation or deposition or diffusion, thereby forming a modified area of the diffused region that is rendered nonconductive to currents passing across it in the diffused region;
   providing other access to the diffused region such that electrical probing may be performed;
   establishing the resistivity of the unmodified diffused region by electrical probing;

measuring the resistance across an area of the diffused region including the modified area; and calculating the size of the modified area of the diffused region by resistive analysis, thus providing an accurate approximation to the size of the original contact window in the insulating layer.

4. A method as described in claim 1, wherein the diameter of the contact window is sufficiently less than the width of the diffused region that any offset of the contact window from a centerline of the diffused region can be ignored, and performing the resistive analysis according to the relationship:

$$R_T = \frac{(2l + d_0 - d)\rho}{wh} + \frac{\rho}{h}\left(-\frac{\pi}{2} + \frac{2W'}{d}\tan^{-1}\left[\frac{1 + \frac{W'}{d}}{\sqrt{\left(\frac{W'}{d}\right)^2 - 1}}\right]\frac{1}{\sqrt{\left(\frac{W'}{d}\right)^2 - 1}}\right).$$

5. A method as described in claim 1, wherein the contact window is substantially circular.

6. A method as described in claim 1, wherein the contact window is rectangular.

7. A method as described in claim 1, wherein the modified area of the diffused region is formed by ion implantation.

8. A method as described in claim 1, wherein the modified area of the diffused region is formed by inverting the conductivity of the diffused region in the immediate vicinity of the contact window, thus forming a diode structure, and applying a reverse bias to the modified area during resistive measurement, thus rendering the modified area effectively nonconducting.

9. A method as described in claim 1 wherein the modified area of the diffused region is formed by implanting an insulating slug into the diffused region by depositing without activating.

10. A method according to claim 1, further comprising: forming a second contact structure in an integrated circuit, said second contact structure aligned along a different axis than the first contact structure and preferably orthogonal to the first contact structure.

* * * * *